United States Patent
Wu et al.

(10) Patent No.: US 9,871,067 B2
(45) Date of Patent: Jan. 16, 2018

(54) INFRARED IMAGE SENSOR COMPONENT

(71) Applicant: TAIWAN SEMICONDUCTOR MANUFACTURING CO., LTD., Hsinchu (TW)

(72) Inventors: Chien-Ying Wu, New Taipei (TW); Li-Hsin Chu, New Taipei (TW); Chung-Chuan Tseng, Hsinchu (TW); Chia-Wei Liu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/051,600

(22) Filed: Feb. 23, 2016

(65) Prior Publication Data
US 2017/0141148 A1 May 18, 2017

Related U.S. Application Data

(60) Provisional application No. 62/256,600, filed on Nov. 17, 2015.

(51) Int. Cl.
*H01L 27/14* (2006.01)
*H01L 27/146* (2006.01)

(52) U.S. Cl.
CPC .. *H01L 27/14616* (2013.01); *H01L 27/14649* (2013.01); *H01L 27/14689* (2013.01); *H01L 27/14694* (2013.01); *H01L 27/14609* (2013.01)

(58) Field of Classification Search
CPC ......... H01L 27/14616; H01L 27/14649; H01L 27/14689; H01L 27/14694
See application file for complete search history.

(56) References Cited

U.S. PATENT DOCUMENTS

| | | | | |
|---|---|---|---|---|
| 7,041,525 B2 * | 5/2006 | Clevenger | ........... | H01L 27/1463 257/E27.133 |
| 7,453,130 B2 * | 11/2008 | Nakai | ............... | H01L 27/14625 257/432 |
| 7,893,468 B2 * | 2/2011 | Gambino | .......... | H01L 27/14632 257/292 |
| 7,897,426 B2 * | 3/2011 | Maehara | ............. | H01L 27/1462 438/69 |
| 8,637,875 B2 * | 1/2014 | Finkelstein | ......... | H01L 31/0336 257/184 |
| 9,040,916 B2 * | 5/2015 | Cazaux | ............. | H01L 27/14621 250/330 |
| 9,312,299 B2 * | 4/2016 | Cellek | ............... | H01L 27/14645 |

(Continued)

OTHER PUBLICATIONS

"Semiconductor bandgap energy vs. lattice constant", Jun. 8, 2010, <http://lab.frumania.com/2010/06/semiconductor-bandgap-energy-vs-lattice-constant/>.

(Continued)

*Primary Examiner* — Ida M Soward
(74) *Attorney, Agent, or Firm* — Maschoff Brennan

(57) ABSTRACT

An infrared image sensor component includes at least one III-V compound layer on the semiconductor substrate, in which the portion of the III-V compound layer(s) uncovered by the patterns is utilized as active pixel region for detecting the incident infrared ray. The infrared image sensor component includes at least one transistor coupled to the active pixel region, and charge generated by the active pixel region is transmitted to the transistor.

16 Claims, 11 Drawing Sheets

(56) References Cited

U.S. PATENT DOCUMENTS

| | | | | |
|---|---|---|---|---|
| 9,431,452 | B1* | 8/2016 | Liu | H01L 27/14645 |
| 2005/0205958 | A1* | 9/2005 | Taniguchi | H01L 27/14621 |
| | | | | 257/436 |
| 2010/0025800 | A1* | 2/2010 | Kim | H01L 27/14634 |
| | | | | 257/459 |
| 2011/0116078 | A1* | 5/2011 | Cho | H01L 27/14625 |
| | | | | 356/51 |
| 2013/0119389 | A1* | 5/2013 | Yamazaki | H01L 27/3246 |
| | | | | 257/59 |
| 2013/0284889 | A1* | 10/2013 | Giffard | H01L 27/14621 |
| | | | | 250/208.1 |
| 2013/0334494 | A1* | 12/2013 | Toda | B82Y 20/00 |
| | | | | 257/14 |
| 2015/0118787 | A1* | 4/2015 | Chu | H01L 27/1463 |
| | | | | 438/73 |
| 2015/0249197 | A1* | 9/2015 | Shieh | H01L 33/642 |
| | | | | 257/72 |
| 2015/0263053 | A1* | 9/2015 | Yamazaki | H01L 27/14616 |
| | | | | 257/43 |
| 2015/0270306 | A1* | 9/2015 | Haddad | H01L 27/14638 |
| | | | | 257/432 |
| 2015/0280047 | A1* | 10/2015 | Seitz | H01L 31/103 |
| | | | | 250/338.4 |
| 2015/0333101 | A1* | 11/2015 | Sakano | H01L 27/1461 |
| | | | | 257/225 |
| 2016/0027837 | A1* | 1/2016 | Webster | H01L 27/14621 |
| | | | | 257/432 |
| 2016/0035921 | A1* | 2/2016 | Matsuda | H01L 27/14645 |
| | | | | 348/374 |
| 2016/0118425 | A1* | 4/2016 | Kurokawa | H01L 27/14616 |
| | | | | 257/43 |

OTHER PUBLICATIONS

Edward D. Palik, Handbook of Optical Constants of Solids, (1985), Academic Press NY.<http://www.cleanroom.byu.edu/OpticalCalc.parts/images/SemiGraph.jpg>.

Jesús A. del Alamo, "Nanometre-scale electronics with III-V compound semiconductors", Nature, vol. 479, Nov. 17, 2011.

* cited by examiner

INFRARED IMAGE SENSOR COMPONENT

RELATED APPLICATIONS

This application claims priority to U.S. Provisional Application Ser. No. 62/256,600, filed Nov. 17, 2015, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation.

In semiconductor technologies, image sensors are used for sensing a volume of exposed light projected towards the semiconductor substrate. Complementary metal-oxide-semiconductor (CMOS) image sensor devices are widely used in various applications such as digital still camera (DSC) applications. These devices utilize an array of active pixels or image sensor cells, including photodiode elements and MOS transistors, to collect photo energy to convert images to streams of digital data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
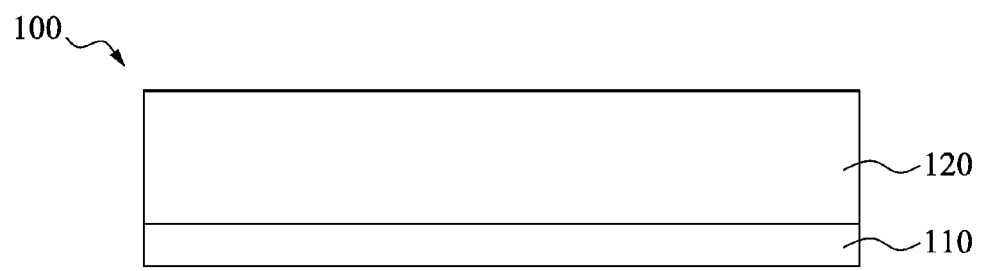
FIG. 1A to FIG. 1E are local cross-sectional views of different stages of a method of manufacturing an infrared image sensor component, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is related to an infrared image senor component. The infrared sensor component includes a substrate, a III-V compound layer disposed on the substrate as an active pixel region, and a plurality of transistors formed on the III-V compound layer. The III-V compound layer is made of III-V groups materials, which have wide infrared wavelength coverage, large absorption coefficient in the infrared region, and high carrier mobility. Therefore, the performance of the infrared image sensor component can be improved accordingly.

FIG. 1A to FIG. 1E are local cross-sectional views of different stages of a method of manufacturing an infrared image sensor component, in accordance with some embodiments of the disclosure. Reference is made to FIG. 1A. A III-V compound layer 120 is formed on a substrate 110. The substrate 110 is a semiconductor substrate. In some embodiments, the semiconductor substrate is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The substrate 110 may optionally include various doped regions, dielectric features, or multilevel interconnects in the semiconductor substrate.

The III-V compound layer 120 is made from the III-V groups in the periodic table of elements. In some embodiments, the III-V compound layer 120 is a single layer having a tuned energy gap. In some other embodiments, the III-V compound layer 120 is a combination of multiple III-V material layers with wide and narrow energy gap. In yet some other embodiments, the III-V compound layer 120 may have gradient energy gap.

The III-V compound layer 120 or each of the layers of the III-V compound layer 120 is made of material selected from a group consisting of $In_wAl_xGa_yAs_z$, $In_wAl_xGa_yP_z$, $In_wAl_xGa_ySb_z$, $In_wAl_xAs_yP_z$, $In_wAl_xP_ySb_z$, $In_wGa_xAs_yP_z$, $In_wGa_xP_ySb_z$, $Al_wGa_xAs_yP_z$, $Al_wGa_xP_ySb_z$, $In_wAs_xP_ySb_z$, $Al_wAs_xP_ySb_z$, $Ga_wAs_xP_ySb_z$, in which w+x+y+z=1. The III-V compound layer 120 can be epitaxially grown by a number of processes including, but not limited to, molecular beam epitaxy (MBE), or metal organic chemical vapor deposition (MOCVD), also known as metal organic vapor phase epitaxy (MOVPE), using appropriate precursors. The thickness of the III-V compound layer 120 is in a ranged from about 0.1 μm to about 10 μm.

Figure 1B:
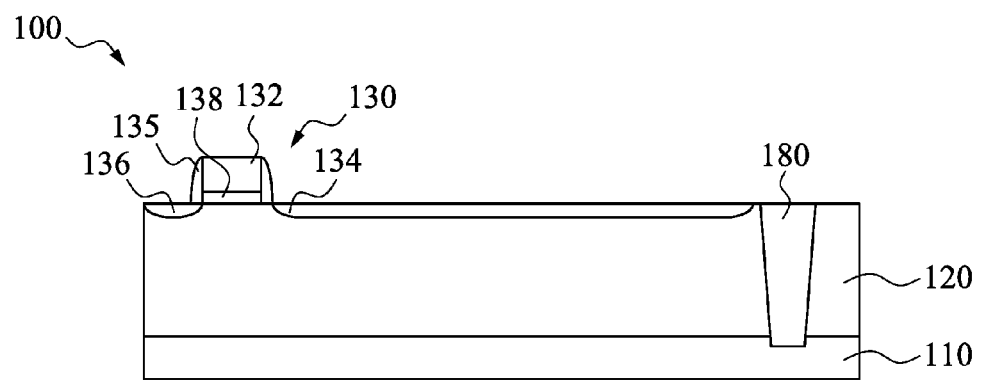

Reference is made to FIG. 1B. At least one transistor 130 is formed on the III-V compound layer 120. The transistors 130 are formed in an array and are arranged corresponding to the pixels of the infrared image senor component 100. In some embodiments, the transistor 130 can be a metal-oxide-semiconductor (MOS) device. Each of the transistors 130 includes a control gate 132 formed on the III-V compound layer 120, and two doped regions 134, and 136 formed in the III-V compound layer 120 and disposed at opposite sides of the control gate 132. The doped regions 134, and 136 may be doped with impurities. The transistor 130 further includes a gate isolation 138 formed between the control gate 132 and the III-V compound layer 120. The transistor 130 further includes sidewalls 135 formed at opposite side surfaces of the control gate 132.

In some embodiments, the transistor 130 is a complementary metal-oxide-semiconductor (CMOS) device. An exemplary method of fabricating the transistor 130 begins at, for instant, forming a photoresist layer on the surface of the III-V compound layer 120. In some embodiments, the III-V compound layer 120 is a P-type layer which includes P-type impurity. The photoresist layer is performed by masking, exposing and developing to define the region for subsequent ion injection, then respectively form a N-type doped regions 134, and 136 in the III-V compound layer 120 by ion injection. The photoresist layer is removed by, such as stripping, after the N-type doped regions 134, and 136 are formed. The doping impurity of forming the N-type doped regions 134, and 136 can be P, As, Si, Ge, C, O, S, Se, Te, or Sb. The doped regions 134, and 136 are generally formed of a low or high concentration impurity region. In some embodiments, the doped regions 134, 136 are regarded as source/drain regions. In some embodiments, the doped region 134 is extended longer than the doped region 136. The N-type doped region 134 and the underlying portion of P-type III-V compound layer 120 may detect incident light.

An isolation layer is further formed on the surfaces of the III-V compound layer 120 by using a low temperature process, in which the isolation layer may be silicon oxide. A conductive layer is further formed on the isolation layer, in which the conductive layer can be doped polycrystalline silicon, tungsten, titanium nitride, or other suitable materials. One or more etching processes are performed to the isolation layer and the conductive layer thereby forming gate isolation 138 and the control gate 132 thereon. Then the sidewalls 135 are formed at the sides of the control gate 132.

The infrared image sensor component 100 further includes at least one shallow trench isolation structure 180. The shallow trench isolation structure 180 is at least formed in the III-V compound layer 120. In some embodiments, the shallow trench isolation structure 180 is formed in the III-V compound layer 120 and in the semiconductor substrate 110. The shallow trench isolation structure 180 is formed next to the doped region 134 to separate the adjacent pixels. The material of the shallow trench isolation structure 180 can be dielectric, such as oxide.

Figure 1C:
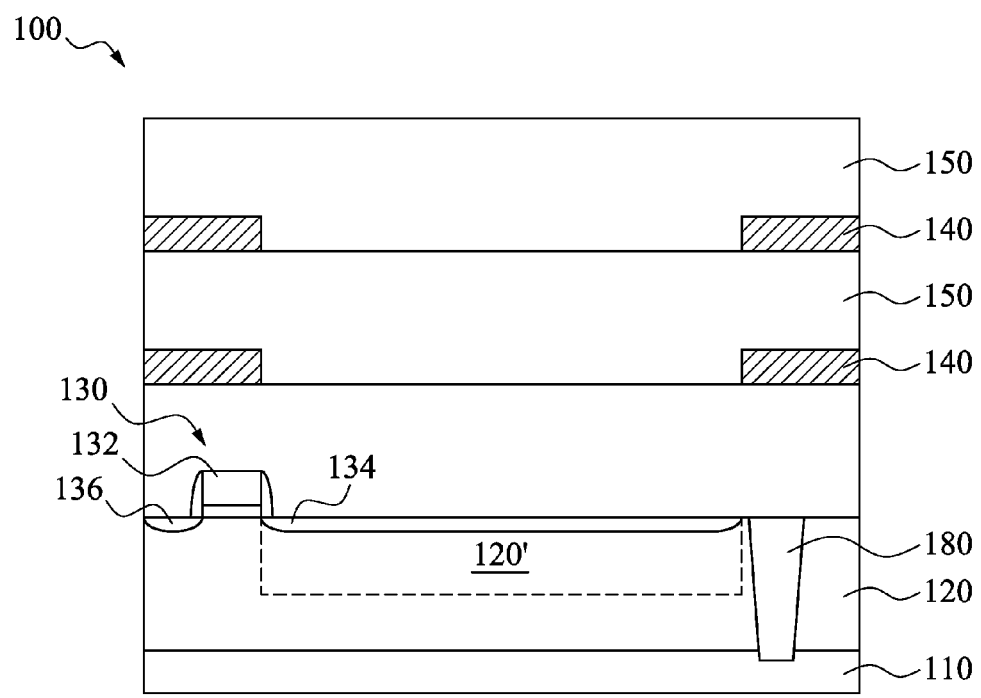

Reference is made to FIG. 1C. A plurality of patterns 140 and a plurality of dielectric layers 150 are sequentially formed on the III-V compound layer 120 and on the transistors 130. The patterns 140 provide functions including wiring and light shielding. The patterns 140 are formed by depositing a conductive layer and etching the conductive layer. The material of the conductive layer may be metal, such as W, Cu, or Co. The dielectric layer 150 is made of insulating material with high transmittance to improve light transmittance. The dielectric layer 150 can be made of silicon oxide, silicon nitride, silicon oxynitride, silicon carbide, low-dielectric constant dielectric material or a combination thereof. The dielectric layer 150 can be formed by a deposition process, such as an ALD process, a CVD process, or a PVD process.

The patterns 140 are formed for shielding a portion of the transistors 130 and a portion of the III-V compound layer 120. Namely, only the doped region 134 and a portion of the III-V compound layer 120 are exposed from the patterns 140. The doped region 134 and the exposed portion of the III-V compound layer 120 are utilized as active pixel region 120' for sensing the light including infrared ray. The active pixel region 120' receives light to generate and accumulate photocharges, and a logic element (not illustrated) may detect electric signals transmitted from the corresponding active pixel region 120'.

The energy gap of the active pixel region 120' can be tuned by the composition of the III-V compound layer 120 and the doped region 134. The energy gap of the active pixel region 120' is tuned corresponding to the wavelength of the incident light such as infrared ray. The active pixel region 120' absorbs incident light and accumulates charges corresponding to an amount and/or intensity of the light. The active pixel regions 120' is coupled with the transistors 130. The transistor 130 includes the control gate 132, and doped regions 134, and 136. The doped region 134 and the underlying III-V compound layer 120 construct the active pixel region 120' for receiving the charges generated by the active pixel region 120'. The charges are transferred to the doped region 136 through the conducted control gate 132. In some embodiments, doped region 136 generally has parasitic capacitance, so charges may accumulate at the doped region 136. The potential of the doped region 136 can be changed by the accumulated charges, and therefore the amount of charges is detected through the change in electric potential of the doped region 136.

In order to prevent light current leakage, the patterns 140 are formed to shield the portion other than the active pixel region 120'. In some embodiments, the patterns 140 are formed covering the control gate 132, and the doped regions 136. The active pixel region 120' and the doped region 134 are exposed from the patterns 140 to receive the incident light, such as infrared ray.

Figure 1D:
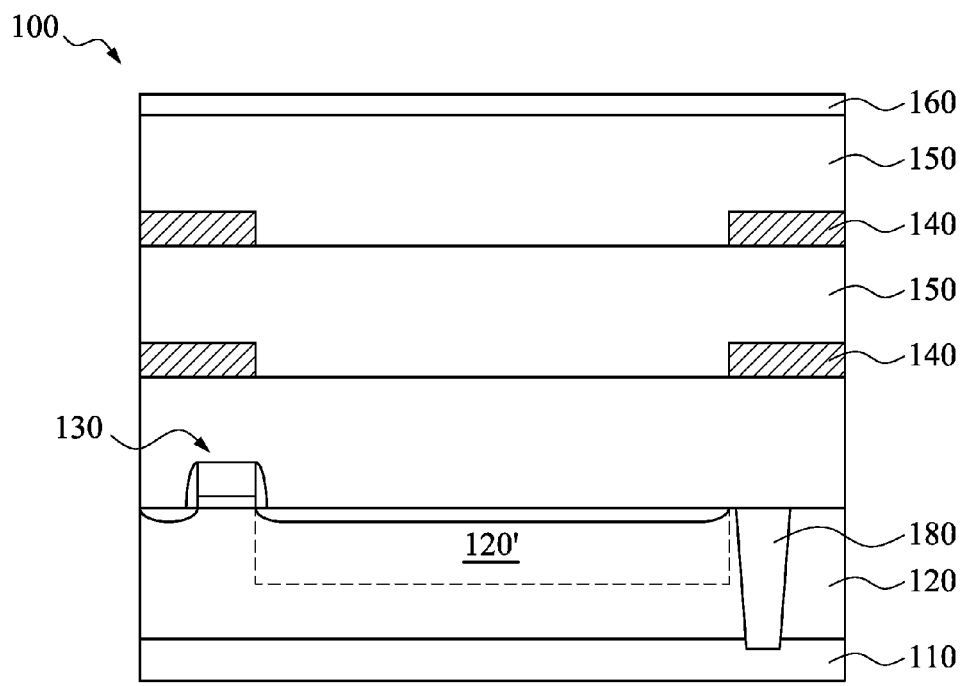

Reference is made to FIG. 1D. An infrared filter 160 is disposed on the dielectric layer 150. The infrared filter 160 is an infrared ray pass filter which passes infrared light while blocking other wavelengths. In some embodiments, the infrared filter 160 is formed of a material capable of blocking out all light except for the spectrum that falls between 800 nanometers and 1000 nanometers.

Figure 1E:
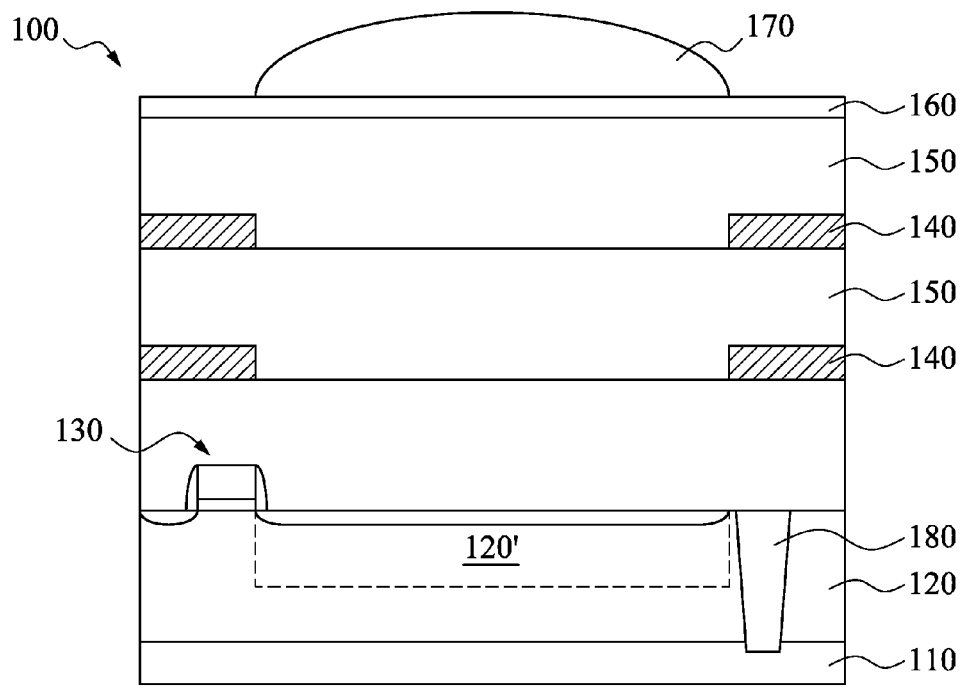

Reference is made to FIG. 1E, an optical lens 170 is formed on the infrared filter 160. The optical lens 170 is formed of thermosetting resin and may have a predetermined curvature radius. The curvature radius of the optical lens 170 can be different depending on the depth of the active pixel region 120', and the wavelength of incident light. The optical lens 170 changes the path of incident light and collects light onto the active pixel region 120'.

Using the III-V compound layer 120 as the active pixel region 120' may reduce the thickness of the infrared image sensor component 100. Comparing with the embodiments of silicon substrate having p-n junction diodes, the III-V compound layer 120 provides wider infrared response. Namely, the III-V compound material has wider infrared wavelength coverage than the silicon, such that the infrared ray including near infrared ray, and middle infrared ray can be detected by the III-V compound layer 120. Also, the III-V compound material has larger absorption coefficient in the infrared region than the silicon, such that the thickness of the III-V compound layer 120 is thinner than the p-n junction diodes. Furthermore, the III-V compound material provides higher carrier mobility than the silicon, thus the pixel response of the infrared image sensor component 100 using the III-V compound layer 120 is faster than that of using the silicon substrate with p-n junction diodes.

Figure 2:
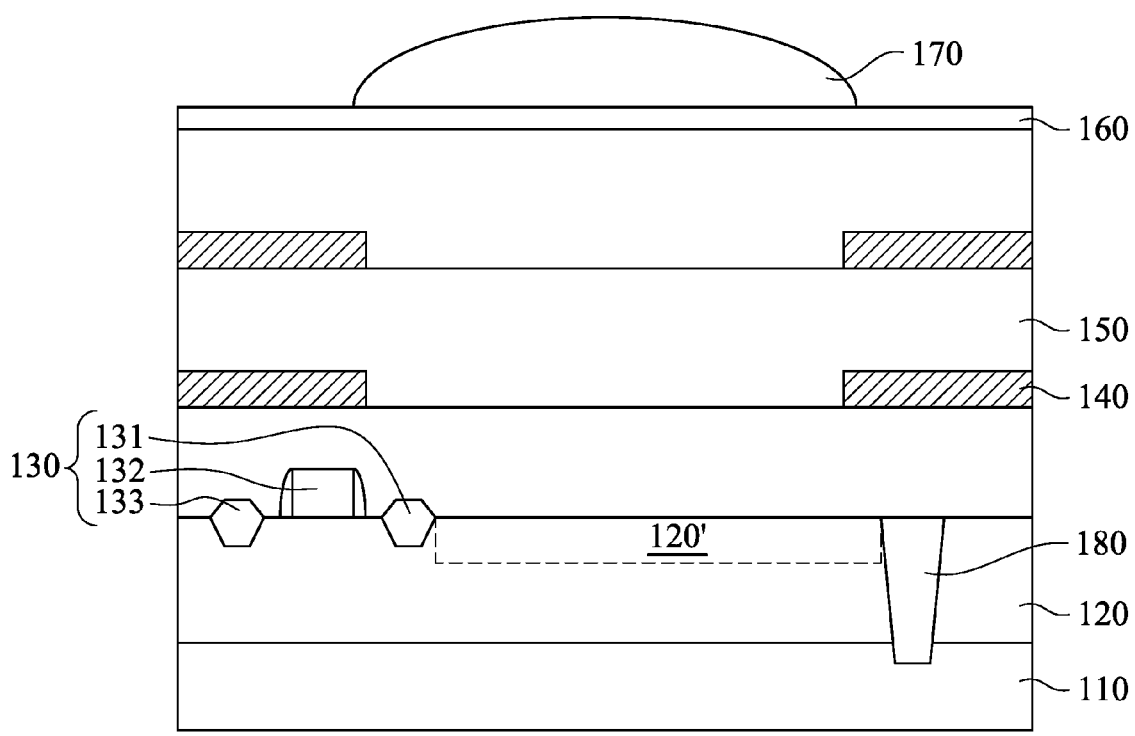
FIG. 2 is a local cross-sectional view of an infrared image sensor component, in accordance with some embodiments of the disclosure.

Reference is made to FIG. 2, which a local cross-sectional view of an infrared image sensor component of some embodiments of the disclosure. The transistor 130 may include epitaxy structures 131 and 133 instead of the doped regions 134 and 136. In order to form the epitaxy structures 131 and 133, a plurality of openings are formed at opposite sides the control gate 132 and in the III-V compound layer 120, and then an epitaxy is performed to grow the epitaxy structures 131 and 133 are formed in the openings. The source/drain stressors form at least parts of the epitaxy structures 131 and 133. In the embodiments in which the transistor 130 is an nMOS device, the epitaxy structures 131 and 133 may include silicon phosphorous (SiP), silicon carbide (SiC), or the like. In the embodiments in which the transistor is a pMOS device, the epitaxy structures 131 and 133 may include silicon germanium (SiGe).

The patterns 140 are formed to shield the control gate 132 and the epitaxy structure 133 and to expose the epitaxy structure 131 and a portion of the III-V compound layer 120. The uncovered III-V compound layer 120 can be utilized as active pixel region 120' to receive the infrared ray and generate photocharges. The epitaxy structure 131 is coupled to the active pixel region 120', thus the charges are received by the epitaxy structure 131 and is further transferred to the epitaxy structure 133 through the conducted control gate 132, and a logic element (not illustrated) may detect electric signals transmitted from the corresponding active pixel region 120'.

The active pixel regions and the transistors of the infrared image sensor component may have various modifications. For example, FIG. 3A to FIG. 3F show local cross-sectional views of different stages of fabricating an infrared image sensor component, in accordance with some other embodiments of the disclosure. The method begins at FIG. 3A, at least one III-V compound layer is formed on a semiconductor substrate 210. In some embodiments, a first III-V compound layer 220, and a second III-V compound layer 230 are formed on a semiconductor substrate 210.

In some embodiments, the semiconductor substrate 210 is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The semiconductor substrate 210 may also include various doped regions, dielectric features, or multilevel interconnects in the semiconductor substrate.

The first III-V compound layer 220 and the second III-V compound layer 230 are compounds made from the III-V groups in the periodic table of elements. However, the first III-V compound layer 220 and the second III-V compound layer 230 are different from each other in composition. The first III-V compound layer 220 and the second III-V compound layer 230 can be respectively epitaxially grown by a number of processes including, but not limited to, metal organic chemical vapor deposition (MOCVD), also known as metal organic vapor phase epitaxy (MOVPE), using appropriate precursors. The first III-V compound layer 220 and the second III-V compound layer 230 directly contact each other.

Different composition of III-V compound materials causes the layers to have different energy gaps. An energy gap discontinuity between the first III-V compound layer 220 and the second III-V compound layer 230, along with the piezo-electric effect, creates a very thin layer 240 of highly mobile conducting electrons in the first III-V compound layer 220. The thin layer 240 contributes to a conductive two dimensional electron gas (2DEG) layer near the junction of the two layers. The thin layer 240 (also referred to as the 2 DEG layer 240) allows charge to flow through the component.

A third III-V compound layer 250 is further formed on the second III-V compound layer 230. In some embodiments, the third III-V compound layer 250 is a doped III-V compound layer, such a p-type doped GaN layer (also referred to as the doped GaN layer 250). The doped GaN layer 250 can be epitaxially grown by MOCVD using appropriate aluminum, nitrogen and gallium precursors. The aluminum precursor includes trimethylaluminum (TMA), triethylaluminum (TEA), or suitable chemical precursors. Exemplary gallium containing precursors are trimethlgallium (TMG), triethylgallium (TEG) or other suitable chemical precursors. Exemplary nitrogen precursors include, but are not limited to, phenyl hydrazine, dimethylhydrazine, tertiarybutylamine, ammonia, or other suitable chemical precursors. The second III-V compound layer 230 can also be referred to as a barrier layer.

Figure 3A:
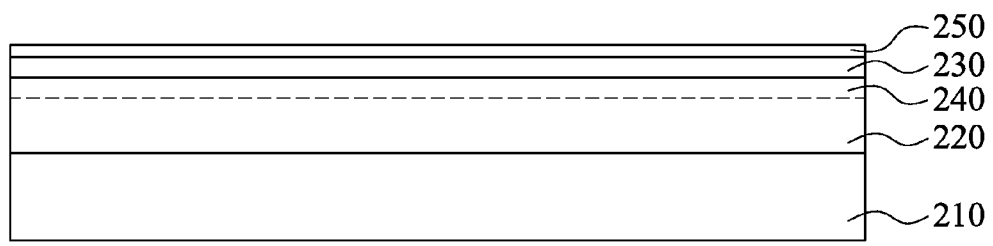
FIG. 3A to FIG. 3F are local cross-sectional views of different stages of fabricating an infrared image sensor component, in accordance with some other embodiments of the disclosure.
Figure 3B:
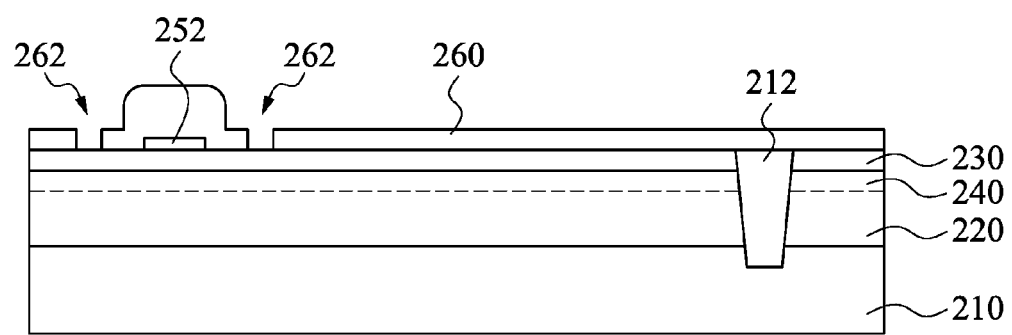

Reference is made to FIG. 3B. The doped third III-V compound layer 250 is patterned for defining at least one doped III-V compound region 252 on the second III-V compound layer 230. The 2 DEG layer 240 under the doped III-V compound region 252 is removed. In some embodiments, a mask layer, such as a photoresist layer is formed on the doped third III-V compound layer 250, and the mask layer is patterned by a lithography process to form a plurality of features and a plurality of openings defined by the features on doped third III-V compound layer 250. The pattern of the mask layer is formed according to a predetermined integrated circuit pattern. The lithography process may include photoresist coating, exposing, post-exposure baking, and developing. Then, an etching process is performed to define the doped III-V compound region 252.

A shallow trench isolation structure 212 is formed in the first III-V compound layer 220 and the second III-V compound layer 230 to define an active pixel region of a pixel. In some embodiments, the shallow trench isolation structure 212 is further formed in the semiconductor substrate 210. The shallow trench isolation structure 212 is a dielectric material, such as oxide. The active pixel region is defined between the III-V doped compound region 252 and the shallow trench isolation structure 212.

A dielectric layer 260 is formed on the doped III-V compound region 252 and on the second III-V compound layer 230. The dielectric layer 260 can be made of silicon oxide, silicon nitride, silicon oxynitride, silicon carbide, low-dielectric constant dielectric material or a combination thereof. The dielectric layer 260 can be formed by a deposition process, such as an ALD process, a CVD process, or a PVD process. The dielectric layer 260 is further patterned to define a plurality of openings 262 in the dielectric layer 260. The dielectric layer 260 is selectively etched and cleaned to define the openings 262. Exemplary etching processes include sputter etching, reactive gas etching, chemical etching and ion milling. The openings 262 are formed at opposite sides of the doped III-V compound region 252. The openings 262 are led into the second III-V compound layer 230. Namely, the thickness of the second III-V compound layer 230 under the openings 262 is thinner than other portions of the second III-V compound layer 230.

Figure 3C:
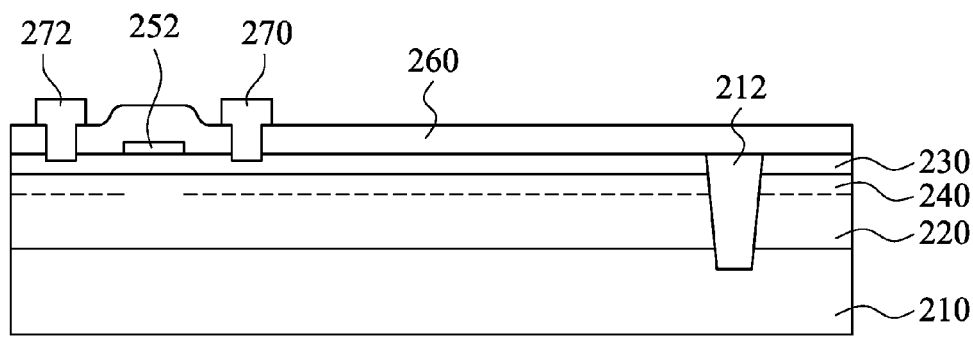

Reference is made to FIG. 3C. A plurality of ohmic metal contacts 270, 272 are formed in the openings 262. The ohmic metal contacts 270, 272 can be formed by depositing a ohmic contact layer on the dielectric layer 260 and in the openings 262, and patterning ohmic contact layer. The deposition process can be sputter deposition, evaporation or chemical vapor deposition (CVD). Exemplary ohmic metals include, but are not limited to, Ta, TaN, Pd, W, WSi2, Ti, Al, TiN, AlCu, AlSiCu and Cu. In some embodiments, the ohmic contacts 270, 272 connect to the second III-V compound layer 230 directly. The ohmic contacts 270, 272 are utilized as a part of drain electrode and a source electrode.

Figure 3D:
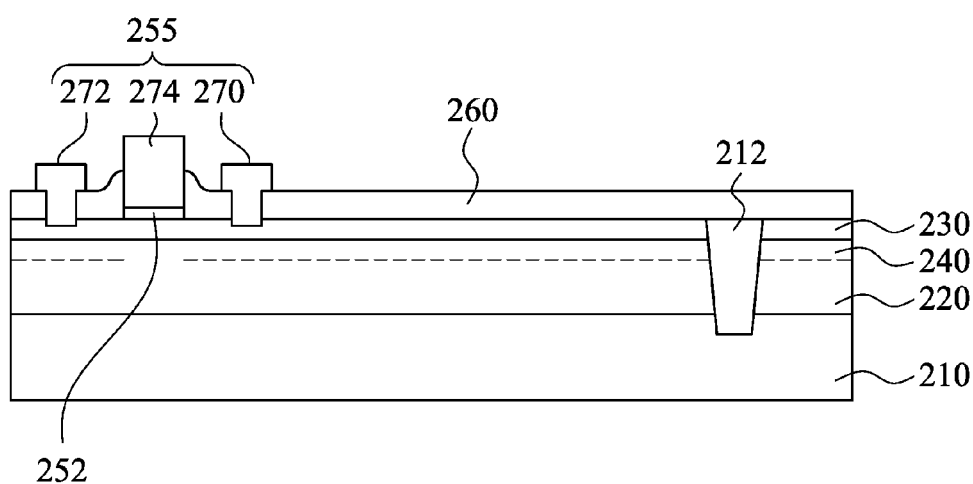

Reference is made to FIG. 3D. The dielectric layer 260 on the III-V doped compound region 252 is etched thereby forming another opening therein. A gate metal stack 274 is further formed in the opening as a gate electrode. The gate metal stack 274 results in a device yielding an enhancement mode (E-mode) device. In the embodiment depicted in FIG. 2D, the gate metal stack 274, the source and drain contacts 270, 272, and the 2 DEG layer 240 (as a channel) in the first III-V compound layer 220 are configured as an E-mode transistor 255, which is a normally off device, and when a positive voltage applied to the gate stack for forward bias is great enough, the E-mode transistor is turned on.

Figure 3E:
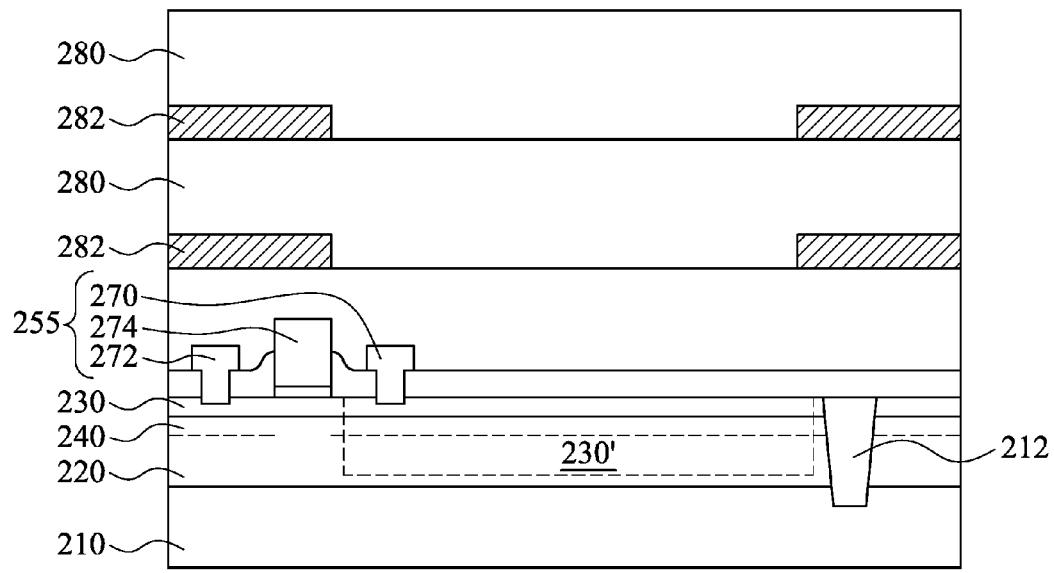

Reference is made to FIG. 3E. A plurality of dielectric layers 280 and a plurality of patterns 282 are sequentially formed on dielectric layer 260 and on the transistor 255. The patterns 282 can be conductive patterns and provide functions including wiring and light shielding. The patterns 282 are formed by depositing a conductive layer and etching the conductive layer. The material of the conductive layer may be metal, such as W, Cu, or Co. The dielectric layers 280 are made of insulating material with high transmittance to improve light transmittance. The dielectric layers 280 can be made of silicon oxide, silicon nitride, silicon oxynitride, silicon carbide, low-dielectric constant dielectric material or a combination thereof. The dielectric layers 280 can be formed by a deposition process, such as an ALD process, a CVD process, or a PVD process.

The patterns 280 are formed for shielding a portion of the transistors and a portion of the second III-V compound layer 230. Namely, only portions of the III-V compound layer 230 are exposed from the patterns 282. The exposed portion of the second III-V compound layer 230 and the underlying 2 DEG layer 240 are utilized as active pixel region 230' for sensing the light including infrared ray. The active pixel region 230' receives light to generate and accumulate photocharges, and a logic element (not illustrated) may detect electric signals transmitted from the corresponding active pixel region 230.

The energy gap of the active pixel region 230' can be tuned by the composition of the first III-V compound layer 220 and the second III-V compound layer 230. The energy gap of the active pixel region 230' is tuned corresponding to the wavelength of the incident light such as infrared ray. The active pixel region 230' absorbs incident light and accumulates charges corresponding to an amount and/or intensity of the light. The active pixel regions 230' is coupled with the transistors 255. The ohmic metal contact 270 is regarded as source and is connected to the active pixel region 230' for receiving the charges generated by the active pixel region 230'. The charges are transferred to the ohmic metal contact 272 through the conducted control gate 252. In some embodiments, charges may accumulate at the ohmic metal contact 272, which is regarded as drain. The potential of the ohmic metal contact 272 can be changed by the accumulated charges, and therefore the amount of charges is detected through the change in electric potential of the ohmic metal contact 272.

In order to prevent light current leakage, the patterns 282 are formed to shield the portion other than the active pixel region 230'. In some embodiments, the patterns 282 are formed covering the doped III-V compound region 252 and the gate metal stack 274 (e.g., the gate), and the ohmic metal contact 272 (e.g., the drain). The active pixel region 230' and the ohmic metal contact 270 between the active pixel region 230' and the doped III-V compound region 252 are exposed from the patterns 282 to receive the incident light, such as infrared ray.

Figure 3F:
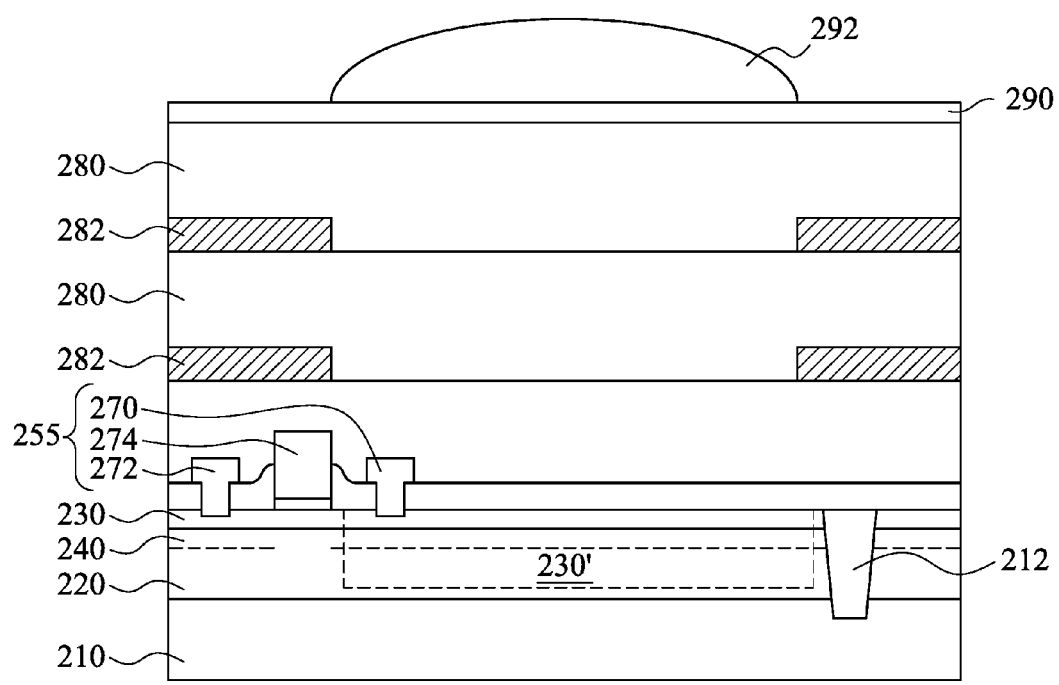

Reference is made to FIG. 3F. An infrared filter 290 is disposed on the dielectric layer 280, and an optical lens 292 is formed on the infrared filter 290. The infrared filter 290 is an infrared ray pass filter. The curvature radius of the optical lens 292 can be different depending on the depth of the active pixel region 230', and the wavelength of incident light. The optical lens 292 changes the path of incident light and collects light onto the active pixel region 230'.

The composition of the III-V compound layers can be modified to tune the energy gap of the III-V compound layers. The composition of the III-V compound layers can be modified by changing the materials of the III-V compound layer, changing the thickness of the III-V compound layer, and/or changing the concentration of the III-V compound layer. Different combinations of the III-V compound layers may result in different response wavelength of the active pixel region. Variations of the combination of the III-V compound layers are discussed in following embodiments.

Figure 4:
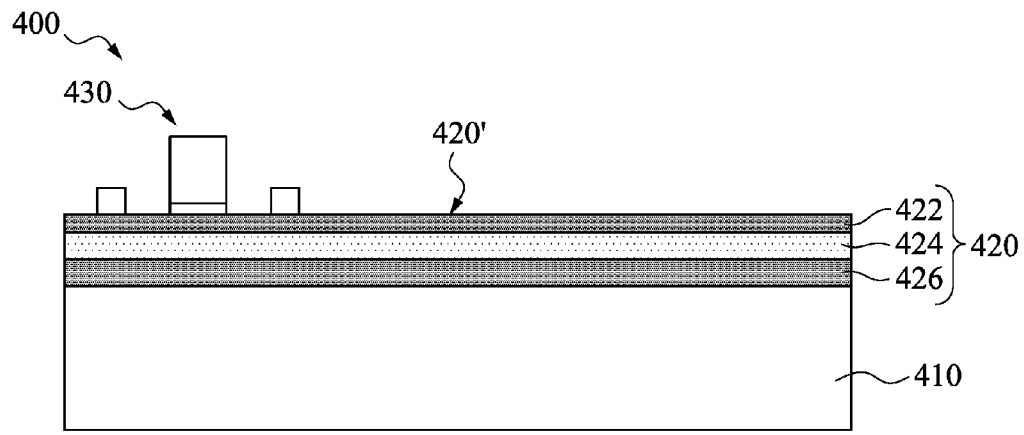
FIG. 4 to FIG. 11 are local cross-sectional views of an infrared image sensor component, in accordance with different embodiments of the disclosure.

FIG. 4 to FIG. 11 are local cross-sectional views of an infrared image sensor component, in accordance with different embodiments of the disclosure. Referring to FIG. 4, an infrared image sensor component 400 including an active pixel region 420' formed on a semiconductor substrate 410, and a transistor 430 coupled to the active pixel region 420' is provided. The active pixel region 420' is the portion of a III-V compound layer stack 420 uncovered by the patterns. The III-V compound layer stack 420 includes a plurality of III-V compound layers 422, 424, and 426, which can be grown by performing a plurality of epitaxially growing processes. The semiconductor substrate 410 can be a silicon substrate. The III-V compound layers 422 and 426 are made of III-V compound having wide energy gap, and the III-V compound layer 424 is made of III-V compound having narrow energy gap. However, the composition of the III-V compound layers 422, 426 may be the same or different. The III-V compound layer 426 is formed on and in contact with the semiconductor substrate 410. The III-V compound layer 424 with narrow energy gap is sandwiched between the III-V compound layers 422, 426 with wide energy gap. The thickness of the III-V compound layers 422, 424, and 426 may be different.

Figure 5:
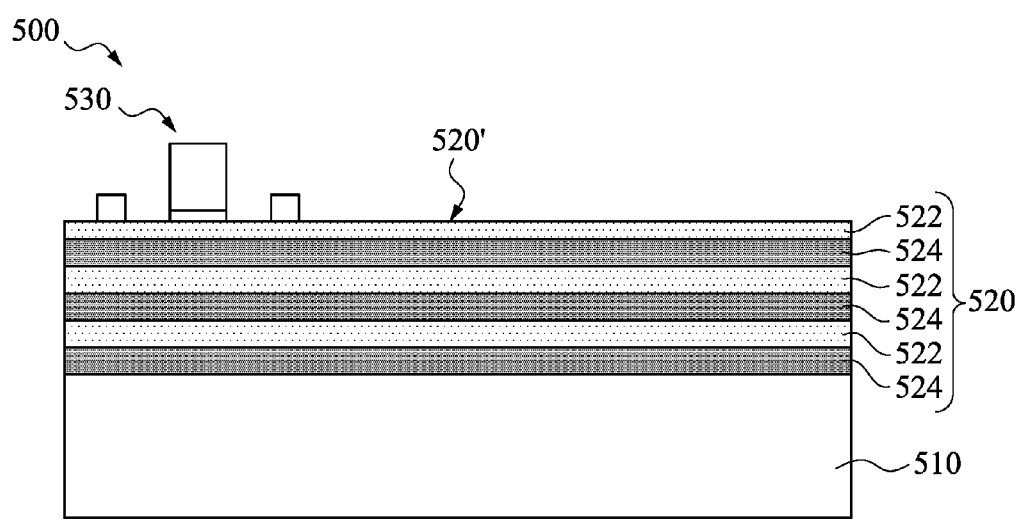

Referring to FIG. 5, an infrared image sensor component 500 including an active pixel region 520' formed on a semiconductor substrate 510, and a transistor 530 coupled to the active pixel region 520' is provided. The active pixel region 520' is the portion of a III-V compound layer stack 520 uncovered by the patterns. The III-V compound layer stack 520 is a multi-layer structure including a plurality of first III-V compound layers 522, and a plurality of second III-V compound layers 524, which can be grown by performing a plurality of epitaxially growing processes. The semiconductor substrate 510 can be a silicon substrate. The first III-V compound layers 522 are made of III-V compound having wide energy gap, and the second III-V compound layers 524 are made of III-V compound having narrow energy gap. In some embodiments, the transistor 530 is formed on the first III-V compound layer 522. The number of the first III-V compound layers 522 can be equal to the number of the second III-V compound layers 524. The first III-V compound layers 522 and the second compound layers 524 are arranged in pair, and the second III-V compound layers 522 with narrow energy gap are respectively sandwiched between the adjacent two of the first III-V compound layers 524 with wide energy gap. The thickness of the first III-V compound layers 522 and thickness of the second III-V compound layers 524 may be substantially the same (except for the uppermost layer 522).

Figure 6:
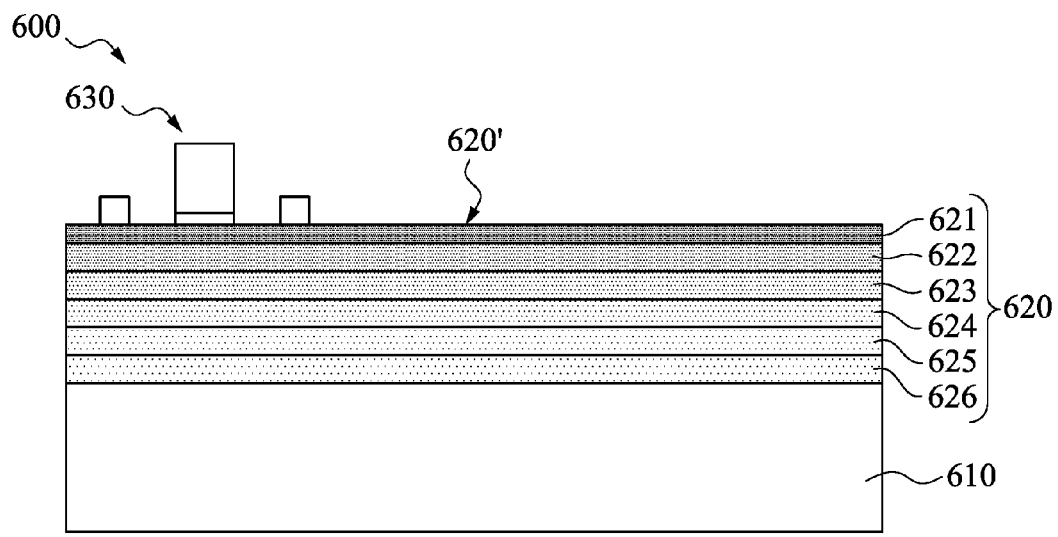

Referring to FIG. 6, an infrared image sensor component 600 including an active pixel region 620' formed on a semiconductor substrate 610, and a transistor 630 coupled to the active pixel region 620' is provided. The active pixel region 620' is the portion of a III-V compound layer stack 620 uncovered by the patterns. The III-V compound layer stack 620 is a multi-layer structure including a plurality of III-V compound layers 621, 622, 623, 624, 625, and 626. The III-V compound layers 621, 622, 623, 624, 625, and 626 are sequentially formed on the semiconductor substrate 610 by performing a plurality of epitaxially growing processes, in which the III-V compound layer 626 is in contact with the semiconductor substrate 610. The energy gap of the III-V compound layers 621, 622, 623, 624, 625, and 626 is sequentially increased, from bottom to top. Namely, the III-V compound layer 626 has the narrowest energy gap among the layers of the III-V compound layer stack 620, and III-V compound layer 621 has the widest energy gap among the layers of the III-V compound layer stack 620. The thickness of the III-V compound layers 622, 623, 624, 625, and 626 can be substantially the same and uniform. Therefore, the III-V compound layer stack 620 can be regarded as having a gradient increasing energy gap, from bottom to top.

Figure 7:
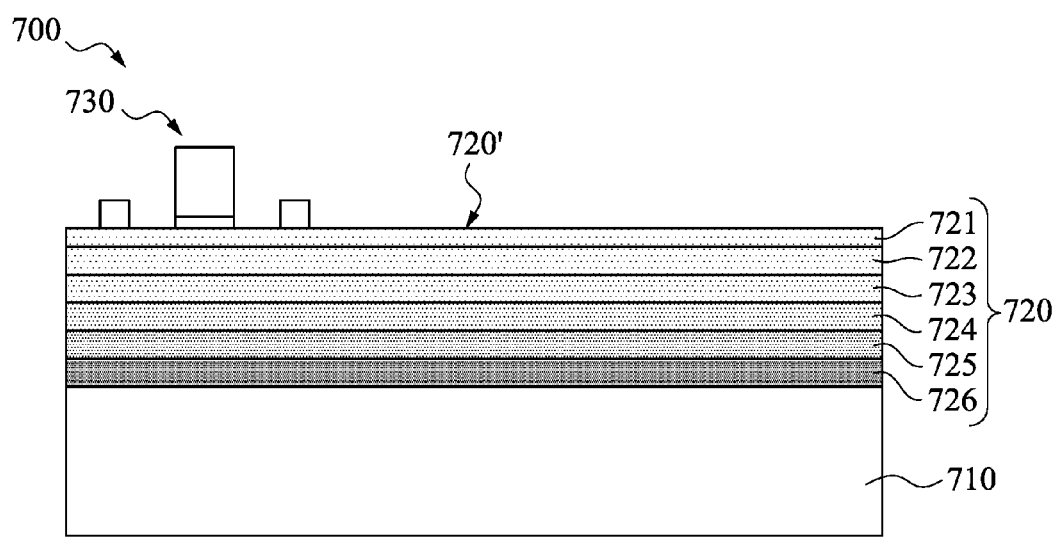

Referring to FIG. 7, an infrared image sensor component 700 including an active pixel region 720' formed on a semiconductor substrate 710, and a transistor 730 coupled to the active pixel region 720' is provided. The active pixel region 720' is the portion of a III-V compound layer stack 720 uncovered by the patterns. The III-V compound layer stack 720 is a multi-layer structure including a plurality of III-V compound layers 721, 722, 723, 724, 725, and 726. The III-V compound layers 721, 722, 723, 724, 725, and 726 are sequentially formed on the semiconductor substrate 710 by performing a plurality of epitaxially growing processes, in which the III-V compound layer 726 is in contact with the semiconductor substrate 710. The energy gap of the III-V compound layers 721, 722, 723, 724, 725, and 726 is sequentially decreased, from bottom to top. Namely, the III-V compound layer 721 has the narrowest energy gap among the layers of the III-V compound layer stack 720, and III-V compound layer 726 has the widest energy gap among the layers of the III-V compound layer stack 720. The thickness of the III-V compound layers 722, 723, 724, 725, and 726 can be substantially the same and uniform. Therefore, the III-V compound layer stack 720 can be regarded as having a gradient decreasing energy gap, from bottom to top.

Figure 8:
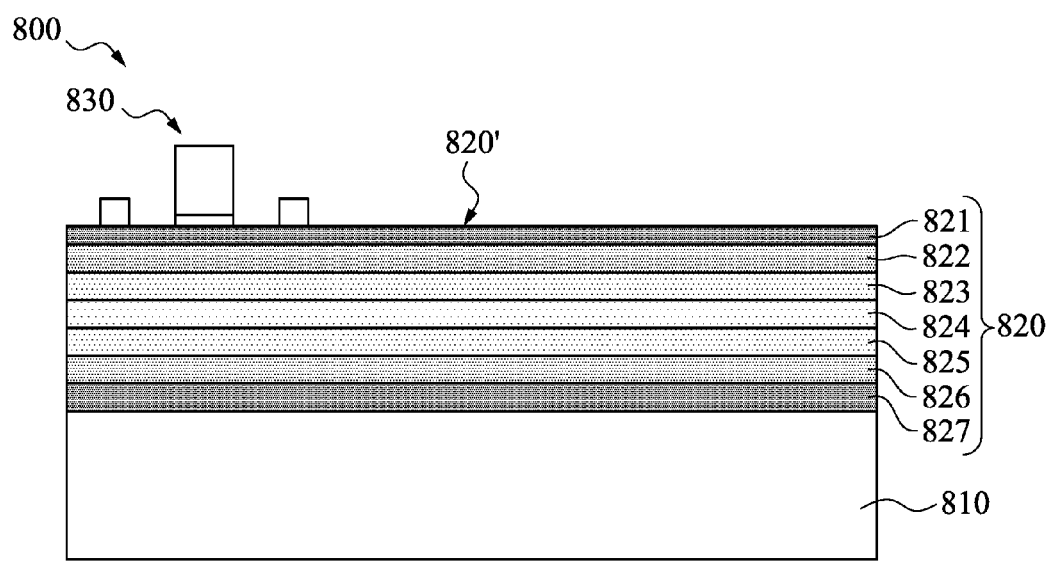

Referring to FIG. 8, an infrared image sensor component 800 including an active pixel region 820' formed on a semiconductor substrate 810, and a transistor 830 coupled to the active pixel region 820' is provided. The active pixel region 820' is the portion of a III-V compound layer stack 820 uncovered by the patterns. The III-V compound layer stack 820 is a multi-layer structure including a plurality of III-V compound layers 821, 822, 823, 824, 825, 826, and 827. The III-V compound layers 821, 822, 823, 824, 825, 826, and 827 are sequentially formed on the semiconductor substrate 810 by performing a plurality of epitaxially growing processes, in which the III-V compound layer 827 is in contact with the semiconductor substrate 810. The energy gap of the layers of the III-V compound layer stack 820 is sequentially decreased, from bottom to middle, and energy gap of the layers of the III-V compound layer stack is sequentially increased, from middle to top. Namely, the III-V compound layer 824 at the middle of the III-V compound layer stack 820 may have the narrowest energy gap among the layers of the III-V compound layer stack 820. The III-V compound layer 821, and 827 at opposite sides of the III-V compound layer stack 820 may have the widest energy gap among the layers of the III-V compound layer stack 820.

Figure 9:
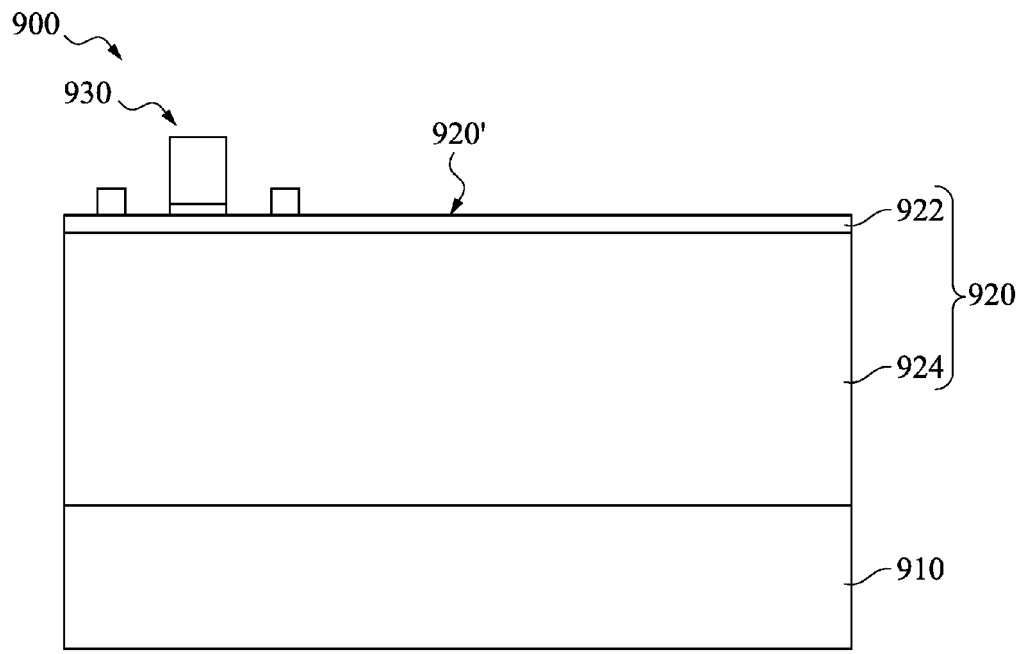

Referring to FIG. 9, an infrared image sensor component 900 including an active pixel region 920' formed on a semiconductor substrate 910, and a transistor 930 coupled to the active pixel region 920' is provided. The active pixel region 920' is the portion of a III-V compound layer stack 920 uncovered by the patterns. The III-V compound layer stack 920 is a multi-layer structure including a first III-V compound layer 922 and a second III-V compound layer 924, in which the second III-V compound layer 924 is disposed between the first III-V compound layer 922 and the semiconductor substrate 910. The energy gap of the first III-V compound layer 922 is different from that of the second III-V compound layer 924 thereby forming a 2 DEG layer therebetween. The thickness of the first III-V compound layer 922 is thinner than that of the second III-V compound layer 924. The energy gap of the first III-V compound layer 922 is substantially consistent since the energy gap of the second III-V compound layer 924 is in a gradient distribution. In some embodiment, the energy gap of the second III-V compound layer 924 is gradually increased from top to bottom. Namely, the portion of the second III-V compound layer 924 close to the first III-V compound layer 922 has a smaller energy gap since the portion of the second III-V compound layer 924 close to the semiconductor substrate 910 has a larger energy gap.

Figure 10:
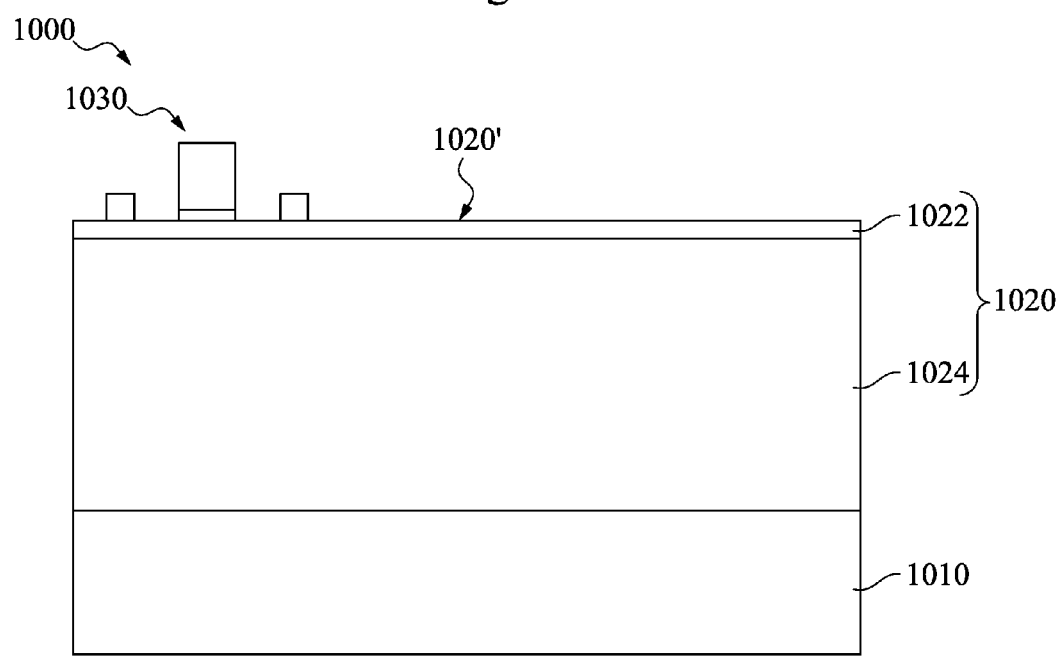

Referring to FIG. 10, an infrared image sensor component 1000 including an active pixel region 1020' formed on a semiconductor substrate 1010, and a transistor 1030 coupled to the active pixel region 1020' is provided. The active pixel region 1020' is the portion of a III-V compound layer stack 1020 uncovered by the patterns. The III-V compound layer stack 1020 is a multi-layer structure including a first III-V compound layer 1022 and a second III-V compound layer 1024, in which the second III-V compound layer 1024 is disposed between the first III-V compound layer 1022 and the semiconductor substrate 1010. The energy gap of the first III-V compound layer 1022 is different from that of the second III-V compound layer 1024 thereby forming a 2 DEG layer therebetween. The thickness of the first III-V compound layer 1022 is thinner than that of the second III-V compound layer 1024. The energy gap of the first III-V compound layer 1022 is substantially consistent since the energy gap of the second III-V compound layer 1024 is in a gradient distribution. In some embodiment, the energy gap of the second III-V compound layer 1024 is gradually decreased from top to bottom. Namely, the portion of the second III-V compound layer 1024 close to the first III-V compound layer 1022 has a larger energy gap since the portion of the second III-V compound layer 1024 close to the semiconductor substrate 1010 has a smaller energy gap.

Figure 11:
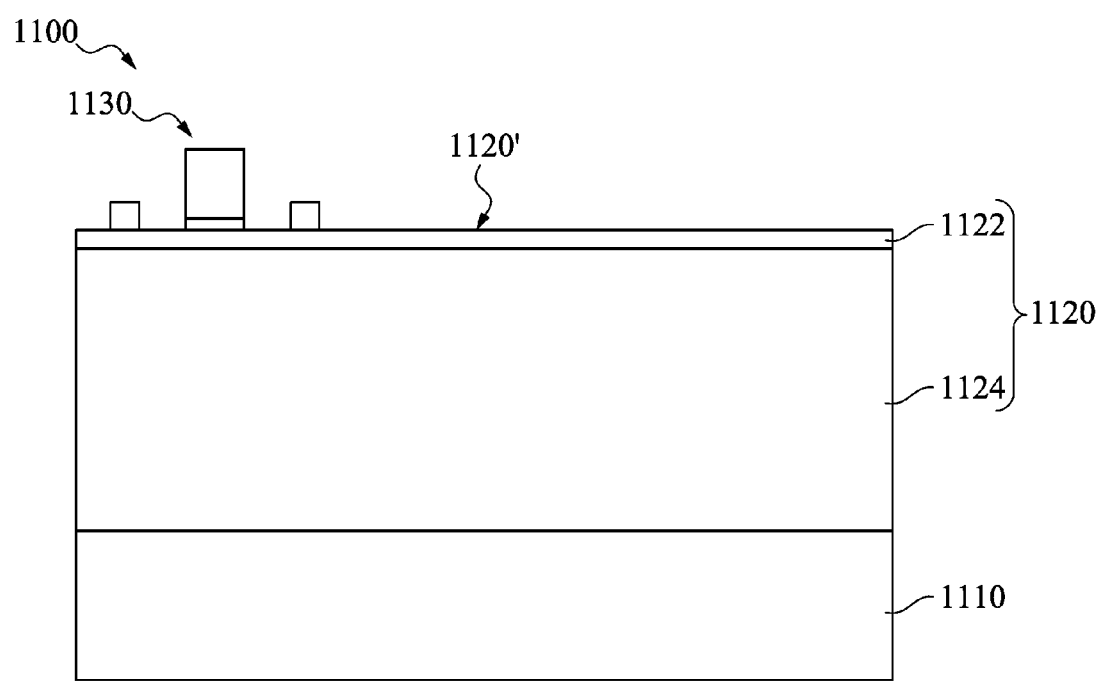

Referring to FIG. 11, an infrared image sensor component 1100 including an active pixel region 1120' formed on a semiconductor substrate 1110, and a transistor 1130 coupled to the active pixel region 1120' is provided. The active pixel region 1120' is the portion of a III-V compound layer stack 1120 uncovered by the patterns. The III-V compound layer stack 1120 is a multi-layer structure including a first III-V compound layer 1122 and a second III-V compound layer 1124, in which the second III-V compound layer 1124 is disposed between the first III-V compound layer 1122 and the semiconductor substrate 1110. The energy gap of the first III-V compound layer 1122 is different from that of the second III-V compound layer 1124 thereby forming a 2 DEG layer therebetween. The thickness of the first III-V compound layer 1122 is thinner than that of the second III-V compound layer 1124. The energy gap of the first III-V compound layer 1122 is substantially consistent since the energy gap of the second III-V compound layer 1124 is in a gradient distribution. In some embodiment, the energy gap of the second III-V compound layer 1124 is gradually decreased from top to middle, and is further gradually increased from middle to bottom. Namely, the portions of the second III-V compound layer 1124 close to the first III-V compound layer 1122 and close to the semiconductor substrate 1110 have a larger energy gap since the middle portion of the second III-V compound layer 1124 has a smaller energy gap.

The infrared image sensor component includes at least one III-V compound layer on the semiconductor substrate, in which the portion of the III-V compound layer(s) uncovered by the patterns is utilized as active pixel region for detecting the incident infrared ray. The infrared image sensor component includes at least one transistor coupled to the active pixel region, and charge generated by the active pixel region is transmitted to the transistor. The III-V compound material has wider infrared wavelength coverage than the silicon, larger absorption coefficient in the infrared region than the silicon, and higher carrier mobility than the silicon, thus performance of the infrared image sensor component is improved accordingly.

According to some embodiments of the disclosure, an infrared image sensor component includes a semiconductor substrate, an active pixel region disposed on the semiconductor substrate for receiving an infrared ray, and a transistor coupled to the active pixel region, in which the active pixel region is made of III-V compound material.

According to some embodiments of the disclosure, an infrared image sensor component includes a semiconductor substrate, at least one III-V compound layer disposed on the semiconductor substrate, a transistor disposed on the III-V compound layer, and a plurality of patterns disposed above the III-V compound layer. The patterns partially shield the III-V compound layer and the transistor, and a portion of the III-V compound layer exposed from the patterns forms an active pixel region for receiving an infrared ray. The transistor is coupled to the active pixel region.

According to some embodiments of the disclosure, a method of manufacturing an infrared image sensor component includes forming at least one III-V compound layer on a semiconductor substrate; forming a transistor on the III-V compound layer; and forming a plurality of patterns partially shielding the transistor and the III-V compound layer. A portion of the III-V compound layer exposed from the patterns forms an active pixel region for receiving an infrared ray, and the transistor is coupled to the active pixel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An infrared image sensor component comprising:
   a semiconductor substrate;
   an active pixel region disposed on the semiconductor substrate for receiving an infrared ray, wherein the active pixel region is made of a III-V compound material; and
   a transistor coupled to the active pixel region, wherein the transistor comprises:
     a doped III-V compound region;
     a gate metal stack disposed on the doped III-V compound region; and
     at least one ohmic metal contact disposed at at least one side of the gate metal stack, wherein the at least one ohmic metal contact is coupled to the active pixel region.

2. The infrared image sensor component of claim 1, wherein the active pixel region comprises a III-V compound layer stack disposed on the semiconductor substrate.

3. The infrared image sensor component of claim 2, wherein the III-V compound layer stack comprises a plurality of III-V compound layers, the III-V compound layers respectively have an energy gap, and the energy gaps of the III-V compound layers are sequentially increased from a side close to the semiconductor substrate to a side away from the semiconductor substrate.

4. The infrared image sensor component of claim 2, wherein the III-V compound layer stack comprises a plurality of III-V compound layers, the III-V compound layers respectively have an energy gap, and the energy gaps of the III-V compound layers are sequentially decreased from a side close to the semiconductor substrate to a side away from the semiconductor substrate.

5. The infrared image sensor component of claim 2, wherein the III-V compound layer stack comprises a plurality of first III-V compound layers, and a plurality of second III-V compound layers having an energy gap wider than that of the first III-V compound layers, wherein the first III-V compound layers and the second III-V compound layers are alternately arranged.

6. The infrared image sensor component of claim 2, wherein an energy gap at a middle of the III-V compound layer stack is narrower than that at opposite sides of the III-V compound layer stack.

7. The infrared image sensor component of claim 2, wherein the III-V compound layer stack comprises:
   a first III-V compound layer; and
   a second III-V compound layer disposed between the first III-V compound layer and the semiconductor substrate, wherein an energy gap of the second III-V compound layer is in a gradient distribution.

8. The infrared image sensor component of claim 7, wherein an energy gap of the second III-V compound layer gradually increases from a top of the second III-V compound layer to a bottom of the second III-V compound layer.

9. The infrared image sensor component of claim 7, wherein an energy gap of the second III-V compound layer gradually decreases from a top of the second III-V compound layer to a bottom of the second III-V compound layer.

10. The infrared image sensor component of claim 1, wherein the III-V compound material is selected from a group consisting of $In_wAl_xGa_yAs_z$, $In_wAl_xGa_yP_z$, $In_wAl_xGa_ySb_z$, $In_wAl_xAs_yP_z$, $In_wAl_xP_ySb_z$, $In_wGa_xAs_yP_z$, $In_wGa_x$-

$P_ySb_z$, $Al_wGa_xAs_yP_z$, $Al_wGa_xP_ySb_z$, $In_wAs_xP_ySb_z$, $Al_wAs_xP_ySb_z$, and $Ga_wAs_xP_ySb_z$, in which $w+x+y+z=1$.

11. The infrared image sensor component of claim 1, further comprising:
at least one pattern shielding the gate metal stack and the at least one ohmic metal contact.

12. An infrared image sensor component comprising:
a semiconductor substrate;
a III-V compound layer stack comprising:
 a first III-V compound layer disposed on the semiconductor substrate; and
 a second III-V compound layer disposed on the first III-V compound layer, wherein the first and second III-V compound layers have different energy gaps;
a transistor coupled to the III-V compound layer stack; and
at least one pattern disposed above the III-V compound layer stack, wherein a portion of the III-V compound layer stack exposed from the at least one pattern forms an active pixel region for receiving an infrared ray.

13. The infrared image sensor component of claim 12, wherein the III-V compound layer stack further comprises a third III-V compound layer disposed over the second III-V compound layer, and an energy gap of the second III-V compound layer is narrower than an energy gap of the third III-V compound layer.

14. The infrared image sensor component of claim 12, wherein an energy gap of the first III-V compound layer is narrower than an energy gap of the second III-V compound layer.

15. The infrared image sensor component of claim 12, wherein an energy gap of the second III-V compound layer is narrower than an energer gap of the first III-V compound layer.

16. The infrared image sensor component of claim 15, wherein the III-V compound layer stack further comprises a third III-V compound layer disposed over the second III-V compound layer, and an energy gap of the second III-V compound layer is narrower than an energy gap of the third III-V compound layer.

* * * * *